United States Patent
Paul et al.

(10) Patent No.: US 11,719,779 B2
(45) Date of Patent: Aug. 8, 2023

(54) ADAPTIVE RECONSTRUCTION OF MR DATA

(71) Applicant: Siemens Healthcare GmbH, Erlangen (DE)

(72) Inventors: Dominik Paul, Bubenreuth (DE); Marcel Dominik Nickel, Herzogenaurach (DE); Nadine Dispenza, Erlangen (DE); Simon Bauer, Baunach (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/662,280

(22) Filed: May 6, 2022

(65) Prior Publication Data

US 2022/0357414 A1    Nov. 10, 2022

(30) Foreign Application Priority Data

May 6, 2021   (EP) .................................... 21172537

(51) Int. Cl.
*G01R 33/56*       (2006.01)
*G01R 33/48*       (2006.01)
*G01R 33/567*      (2006.01)

(52) U.S. Cl.
CPC ..... *G01R 33/5608* (2013.01); *G01R 33/4818* (2013.01); *G01R 33/5676* (2013.01)

(58) Field of Classification Search
CPC ............ G01R 33/4818; G01R 33/5608; G01R 33/5676
See application file for complete search history.

(56) References Cited

U.S. PATENT DOCUMENTS

| 5,517,122 A | 5/1996 | Chen |
| 9,317,917 B2 * | 4/2016 | Stemmer ................. G06T 5/001 |
| 2009/0001984 A1 | 1/2009 | Hwang |
| 2010/0013475 A1 | 1/2010 | Kimura |

(Continued)

OTHER PUBLICATIONS

Zhang L. et al: "HASTE Sequence with Parallel Acquisition and T2 Decaym Compensation: Application To Carotid Artery Imaqinq," Magnetic Resonance Imaging, Elsevier Science, Tarrytown, NY, US; vol. 27, No. 1, Jan. 1, 2009 (Jan. 1, 2009); pp. 13-22, XP025799153.

(Continued)

*Primary Examiner* — Gregory H Curran
(74) *Attorney, Agent, or Firm* — Banner & Witcoff Ltd.

(57) ABSTRACT

An adaptive reconstruction of MR data, including acquired MR data of a core region having core segments and simulated MR data of a peripheral region. The method includes ascertaining a peripheral signal based on the MR data of the peripheral region, determining a scaling factor for each core segment by taking into account the peripheral signal and a mean signal intensity of the MR data for the respective core segment, scaling the MR data of the core region by taking into account the MR data of each core segment and that of the scaling factor corresponding to the respective core segment, generating filtered MR data by combining the scaled MR data of the core region with the MR data of the peripheral region, and reconstructing image data from the filtered MR data.

13 Claims, 7 Drawing Sheets

(56) References Cited

U.S. PATENT DOCUMENTS

2015/0185303 A1* 7/2015 Umeda ................ G01R 33/482
                                                           324/309
2019/0391222 A1* 12/2019 Majumdar ............. G16H 30/20
2020/0284866 A1   9/2020 Kim et al.

OTHER PUBLICATIONS

Knoll Florian et al: "Deep-Leerning Methods for Parallel Magnetic Resonance Imaging Reconstruction: A Survey of the Current Approaches, Trends, and Issues"; IEEE Signal Proces Sing Magazine, IEEE Service Center, Piscataway, NJ, US; vol. 37, No. 1, Jan. 1, 2020 (Jan. 1, 2020); pp. 128-140, XP011767148.

Han, Yoseo et al: "k-Space Deep Learning for Accelerated MRI," IEEE Transactions on Medical Imaging, IEEE Service Center, Piscataway, NJ, US; vol. 39, No. 2, Jul. 4, 2019 (Jul. 4, 2019); pp. 377-386, XP011769476.

Li V. et al: "A Review of the Deep Learning Methods for Medical Images Super Resolution Problems"; IRBM, Elsevier, Amsterdam, NL; vol. 42, No. 2, Aug. 18, 2020 (Aug. 18, 2020), pp. 120-133, XP086526328.

* cited by examiner

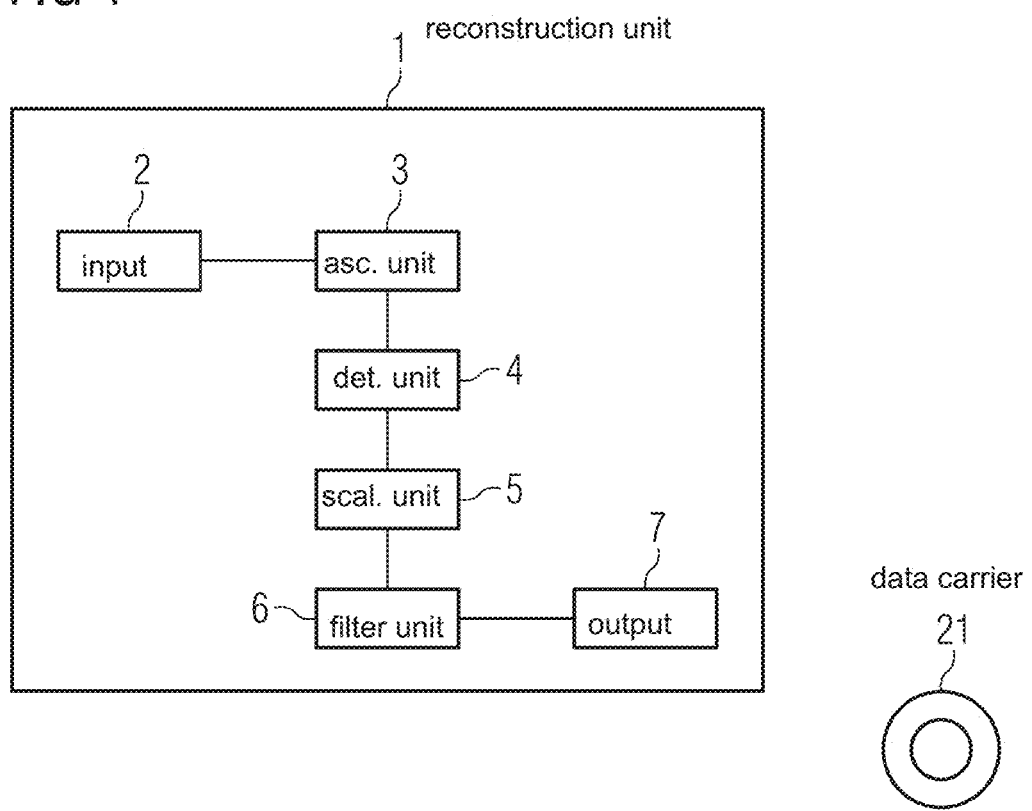

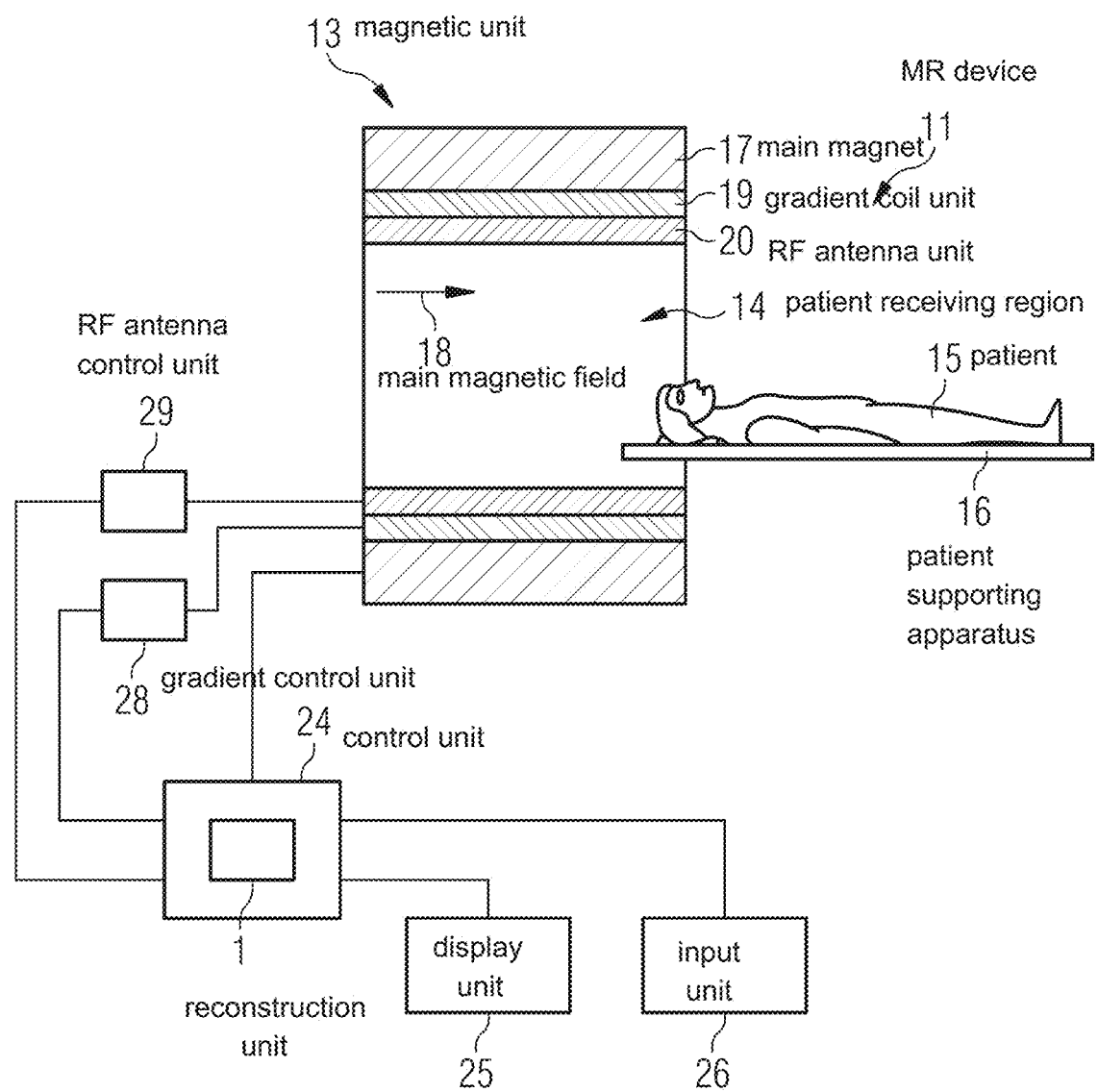

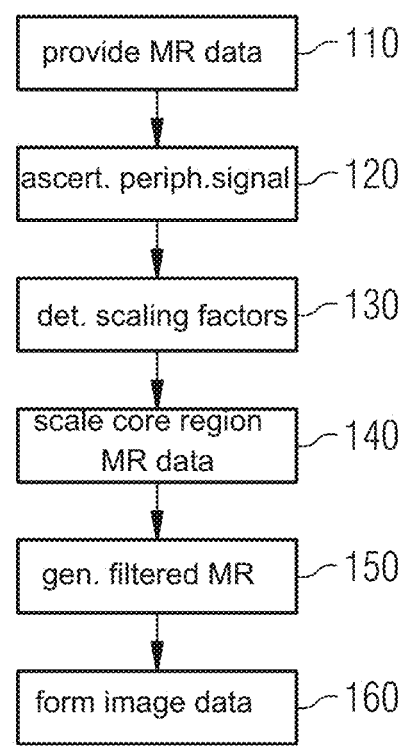

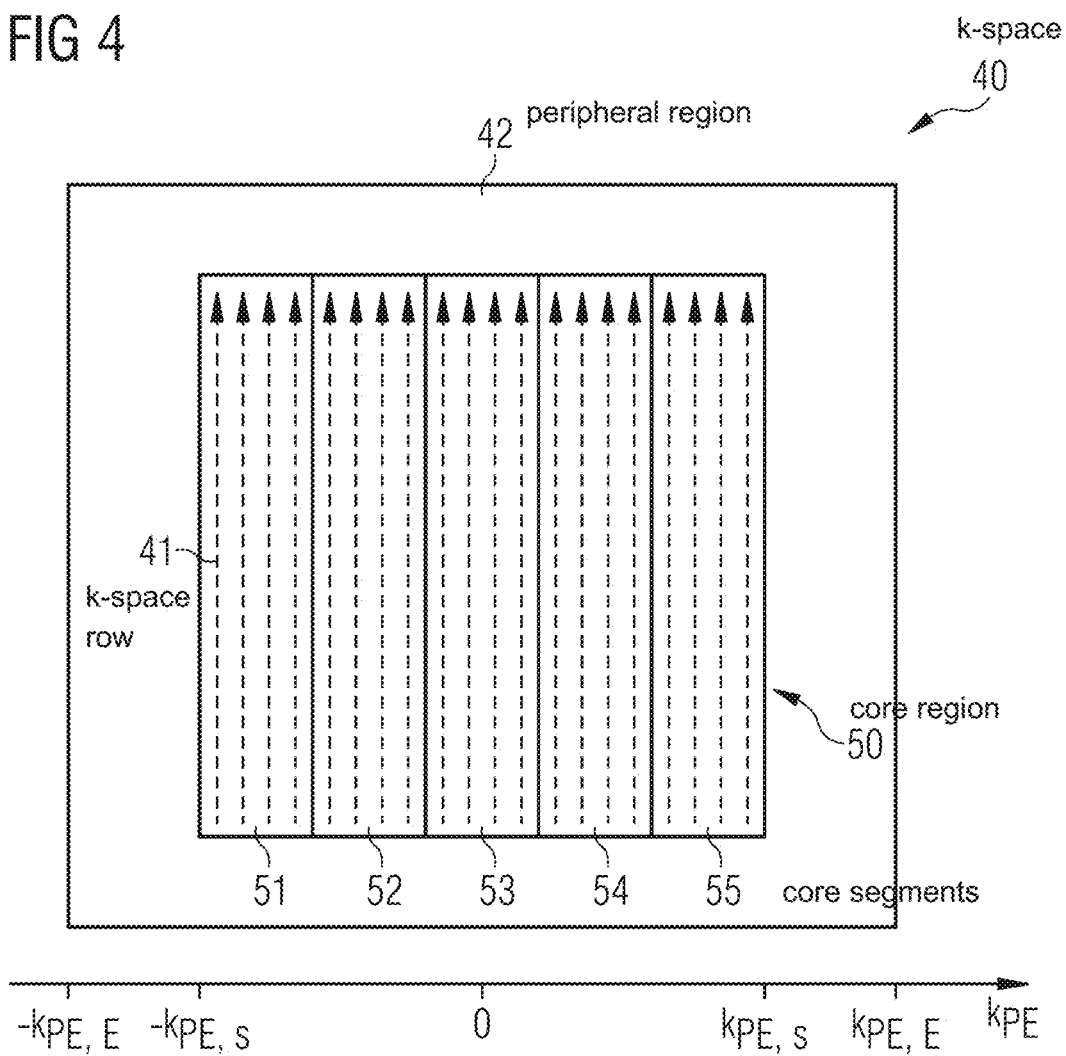

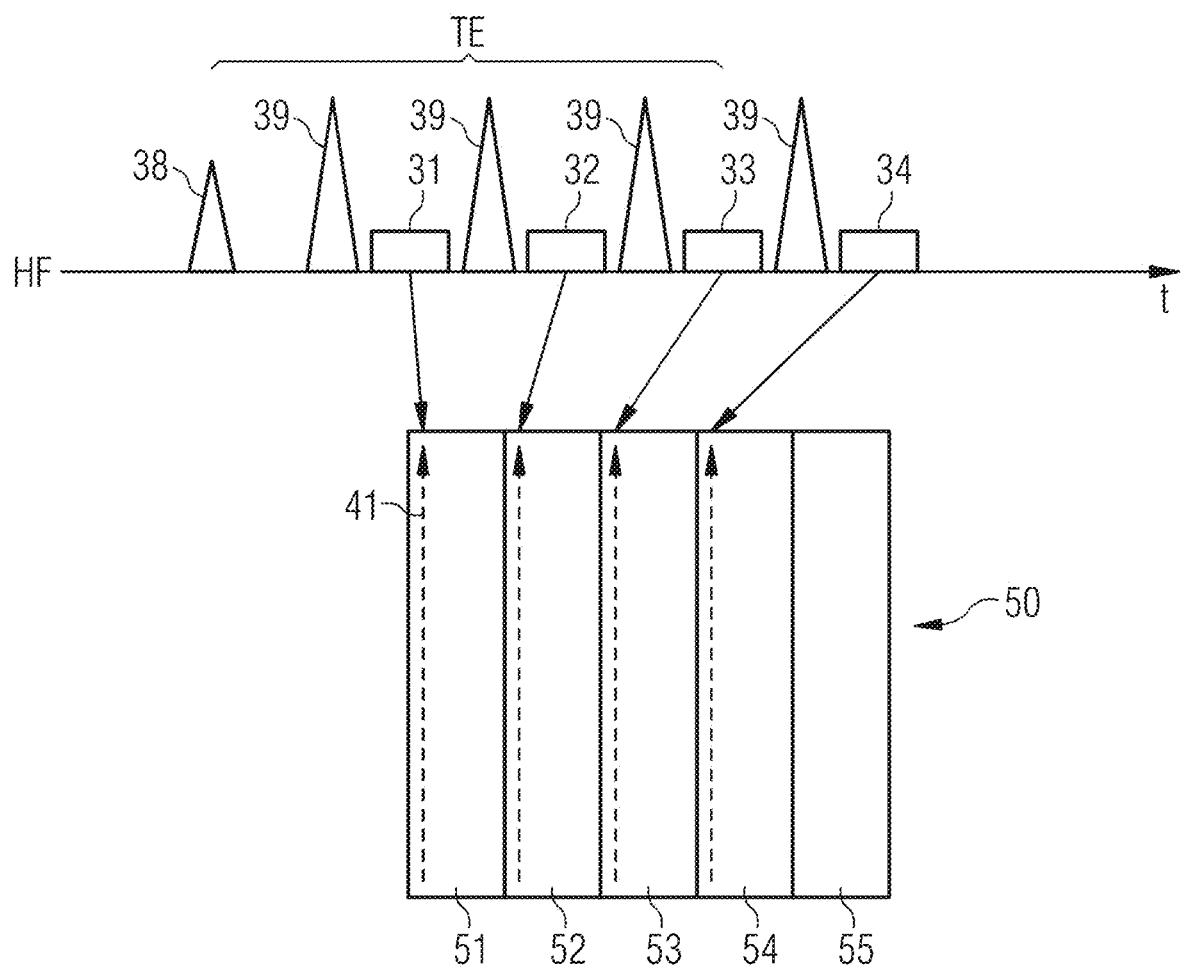

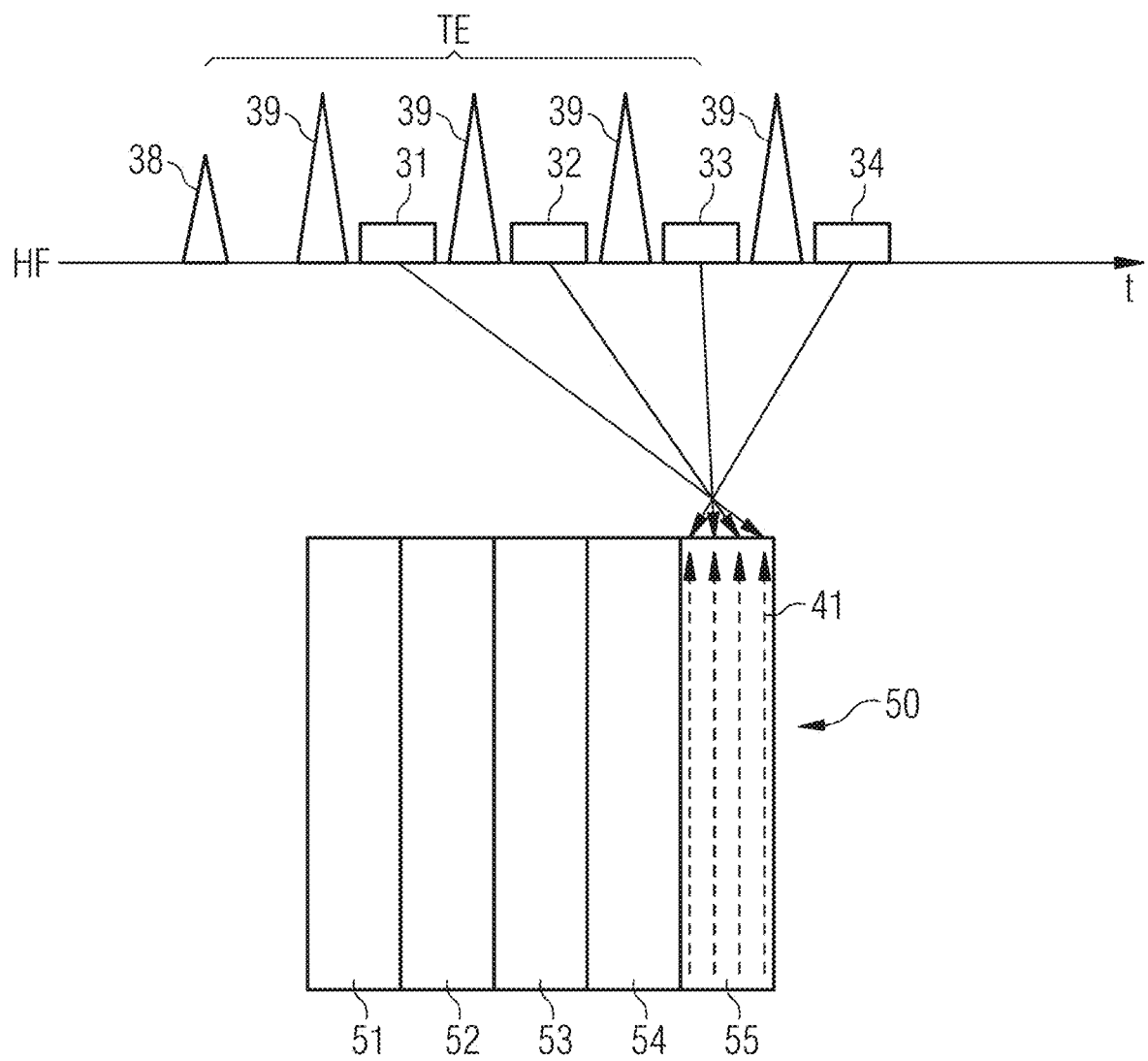

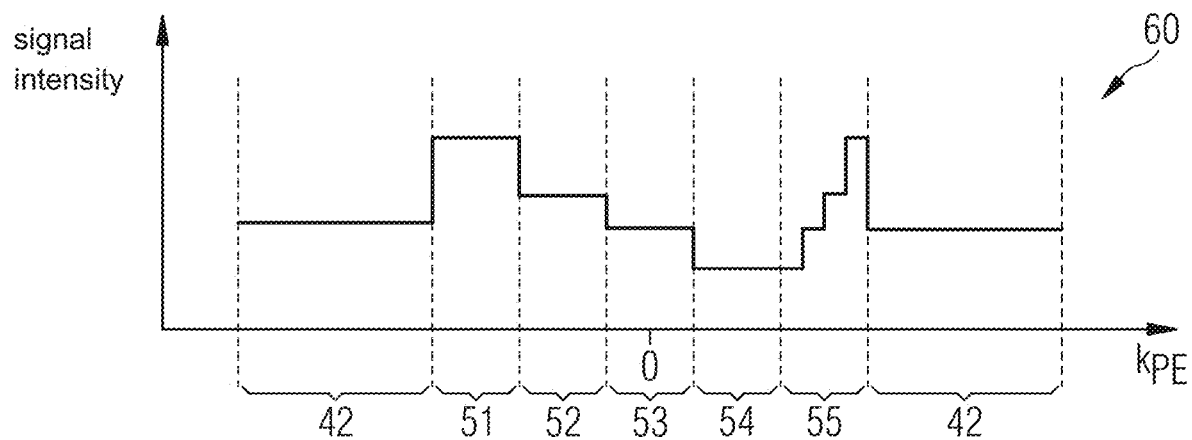
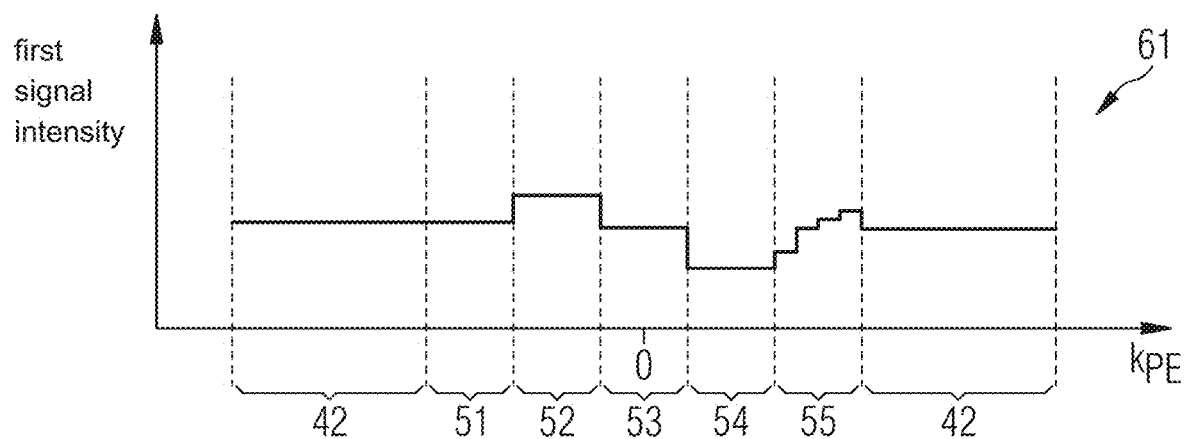
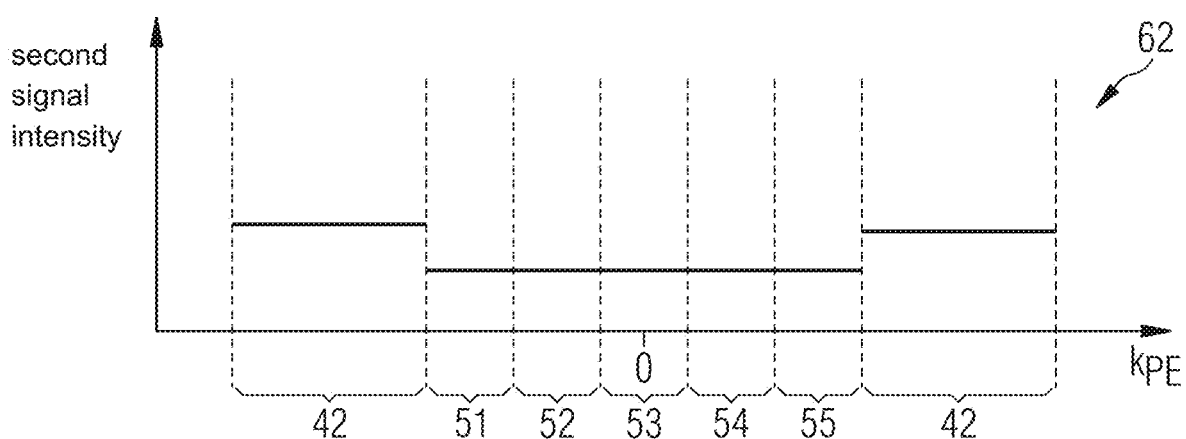

ADAPTIVE RECONSTRUCTION OF MR DATA

TECHNICAL FIELD

The disclosure relates to a method, a reconstruction unit, a magnetic resonance device, a computer program product and an electronically readable data carrier for an adaptive reconstruction of MR data.

BACKGROUND

Conventionally, the body to be examined of an examination object, in particular of a patient, is exposed in a magnetic resonance device and with the aid of a main magnet to a relatively high main magnetic field, for example of 1.5 or 3 or 7 tesla. In addition, gradient pulses are played out with the aid of a gradient coil unit. High-frequency radio-frequency pulses, for example excitation pulses, are then emitted via a radio-frequency antenna unit by means of suitable antenna facilities, and this results in the nuclear spins of particular atoms resonantly excited by these radio-frequency pulses (RF pulses) being tilted by a defined flip angle with respect to the magnetic field lines of the main magnetic field. Radio-frequency signals, what are known as magnetic resonance signals (MR signals), are irradiated during the relaxation of the nuclear spins, and these are received by means of suitable radio-frequency antennas and then processed further. Finally, the desired image data can be reconstructed from the thus acquired raw data.

A particular magnetic resonance control sequence (MR control sequence), also called a pulse sequence, is to be emitted for a particular measurement therefore, and this is composed of a sequence of radio-frequency pulses, for example excitation pulses and refocusing pulses, as well as gradient pulses to be emitted so as to be appropriately coordinated therewith in different gradient axes along different spatial directions. Readout windows are set that are appropriate time-wise, and these specify the periods in which the induced MR signals are ascertained.

The data space, in which the MR signals are present, is referred to as the k-space. The MR signals are digitized and filed as complex numerical values in a k-space matrix along k-space rows in the direction of the frequency encoding. The complex numerical values in the k-space are referred to as raw data, in particular as MR data. Associated image data can be reconstructed from the raw data, for example by means of a Fourier transformation.

The occupancy of the k-space with complex numerical values influences the image data. The MR data typically satisfies the Nyquist criterion for a correct reproduction of the anatomy of the examination object. In addition, the k-space, in particular the k-space matrix, determines the resolution of the image data, in other words the size of the pixels of the image data. The value range of the k-space has to be increased in order to increase the resolution of the image data. The greater the resolution of the image data, the smaller the size of the pixels of the image data is. The MR data in the center of the k-space determines the contrast of the image data. The center of the k-space is typically occupied by MR data.

The duration of an examination of an examination object typically correlates with the quantity of MR data acquired, in other words the quantity of raw data. The longer an examination lasts, the more uncomfortable, susceptible to faults and cost-intensive an examination is. Consequently, there are numerous approaches in MR imaging for the reduction in the MR data to be acquired. One method provides acquisition of MR data in a core region of the k-space, whereas a peripheral region of the k-space is filled by means of "zero filling" and/or simulated MR data. "Zero filling" and/or a simulation of MR data do not require any acquisition of MR data and typically do not lengthen the duration of the examination. The value range of the k-space can be enlarged by the peripheral region by means of "zero filling" and/or a simulation of MR data, however, and this can increase the resolution of the image data to be reconstructed. The core region of the k-space comprises a volume in the k-space surrounding the center of the k-space. The peripheral region of the k-space typically adjoins the core region and/or surrounds it at least partially.

SUMMARY

An object underlying the disclosure is to disclose a particularly robust method for an adaptive reconstruction of MR data, comprising a simulated signal in the peripheral region of the k-space.

The disclosed method provides an adaptive reconstruction of MR data. The method comprises provision of MR data comprising MR data of a core region of a k-space and MR data of a peripheral region of the k-space. The MR data of the peripheral region comprises a simulated signal not equal to zero. The core region of the k-space comprises at least three core segments, wherein each core segment of the at least three core segments comprises mutually parallel k-space rows and the core segments are arranged relative to each other in such a way that the parallel k-space rows incorporated by them are mutually parallel. The MR data of the core region is characterized by an acquisition comprising multiple time-sequential carrying out of the following steps in order in each case to capture the MR data of an echo train: switching an excitation pulse, and switching a plurality of refocusing pulses, wherein between two successive refocusing pulses, one reading out each takes place of a k-space row, in particular an echo of the echo train, associated with one of the at least three core segments.

The disclosed method comprises the following method steps, moreover:

ascertaining a peripheral signal based on the MR data of the peripheral region, determining a scaling factor for each core segment by taking into account the peripheral signal and a mean signal intensity of the MR data for the respective core segment, scaling the MR data of the core region by taking into account the MR data of each core segment and that of the scaling factor corresponding to the respective core segment, generating filtered MR data by way of combination of the scaled MR data of the core region with the MR data of the peripheral region, and reconstructing image data from the filtered MR data.

A k-space row typically runs in the direction of the frequency encoding. A k-space row is typically perpendicular to the phase encoding direction. A core segment can comprise a k-space row. A core segment can comprise at least two k-space rows, preferably at least four k-space rows, particularly preferably at least seven k-space rows. A core segment typically comprises a greater value range of the k-space in the direction of the frequency encoding than in the phase encoding direction. The at least three core segments are typically characterized by mutually different value ranges for the phase encoding direction.

The MR data of the peripheral region is typically ascertained by simulation, in particular by means of a simulation algorithm. The MR data of the peripheral region is preferably simulated by taking into account the MR data of the core region. The disclosed method can optionally comprise the simulation of the MR data of the peripheral region. The use of simulated MR data comprising signal not equal to zero, in other words a signal intensity having an amplitude greater than zero, can result in an increase in the resolution of the image data to be reconstructed and therewith to an improved quality of the image data.

The MR data of the core region was preferably acquired in advance by means of a spin echo (SE)-based, in particular a turbo spin echo (TSE)-based MR control sequence. An MR control sequence of this kind typically generates a plurality of echo trains in each case induced by an excitation pulse followed by at least two successive refocusing pulses. Each refocusing pulse typically induces an echo during which MR data is acquired for a k-space row. An MR control sequence of this kind typically provides time-sequential carrying out of a plurality of echo trains. An excitation pulse is typically an RF pulse inducing a flip angle of 90°. A refocusing pulse is typically an RF pulse inducing a flip angle between 90° and 180°.

Ascertainment of a peripheral signal preferably comprises determination of a mean signal intensity of the MR data of the peripheral region. The peripheral signal can correspond, for example, to a mean and/or a median of the MR data of the peripheral region. The mean signal intensity of the MR data for each core segment can comprise a mean and/or a median of the MR data for each core segment. Scaling of the MR data of the core region can comprise a multiplication of the MR data of each core segment by the corresponding scaling factor.

The combination of the scaled MR data of the core region with the MR data of the peripheral region can comprise scaling of the MR data of the peripheral region by taking into account at least one scaling factor for at least one core segment. The combination of the scaled MR data of the core region with the MR data of the peripheral region preferably comprises replacing the MR data of the core region with the scaled MR data of the core region while retaining the MR data of the peripheral region. The reconstruction of image data from the filtered MR data preferably comprises a Fourier transformation of the filtered MR data.

The MR data of the core region and/or the MR data of the peripheral region and/or the peripheral signal and/or the scaled MR data and/or the filtered MR data are typically present in the raw data space, in particular in the k-space. The reconstructed image data typically lie in the image space.

This method accordingly allows for an adaptive reconstruction as a function of MR data by taking into account different signal intensities in the core region and the simulated MR data of the peripheral region. Due to a selected MR control sequence the core segments typically have different mean signal intensities, which in turn differ from the peripheral signal. Scaling allows an adjustment of the signal intensities in the core region to the peripheral signal and/or an alignment of the mean signal intensities of the core segments with each other. Signal variations due to the MR control sequence, in other words caused by the acquisition technique, can be compensated hereby. This reduces artifacts, for example in the form of ringing, in the image data. Conventional filtering of the MR data, in particular in the transition region between core region and peripheral region, cannot be achieved in particular with a simulated signal not equal to zero and would cause a deterioration in the quality of the image data. The disclosed adaptive reconstruction accordingly allows a robust reduction of artifacts, in particular also with a simulated signal not equal to zero in the peripheral region. In addition, the method takes place automatically and therewith very robustly.

One aspect of the method provides that the scaling factor is determined in such a way that the difference between the peripheral signal and the mean signal intensity of the scaled MR data of a core segment adjacent to the peripheral region is minimized.

A core segment adjacent to the peripheral region is preferably characterized in that one k-space row of two directly adjacent k-space rows of the core segment and the other k-space row of the two directly adjacent k-space rows are incorporated by the peripheral region. Depending on the technique used for the acquisition of the MR data of the core segments, a core segment adjacent to the peripheral region can have a mean signal intensity, which is, for example, at least 20% and/or at least 50% and/or at least 100% greater than the peripheral signal.

The smaller the difference between the scaled MR data of a core segment adjacent to the peripheral region and the peripheral signal, the smaller the artifacts, such as ring shapes, are. A minimization of the difference between the peripheral signal and the mean signal intensity of the scaled MR data of a core segment adjacent to the peripheral region in the context of determination of the scaling factor accordingly allows a particularly good reduction of artifacts.

Conventionally, the peripheral region comprises MR data with a signal intensity of zero, and this is referred to as "zero filling". The boundary between the core region, which has MR data that is not equal to zero, and the peripheral region comprising MR data with a signal intensity of zero is conventionally smoothed by means of a filter in order to prevent artifacts such as ringing. This filtering fails if MR data of the peripheral region comprises a simulated signal not equal to zero. The proposed method accordingly allows a solution for a simulated signal not equal to zero.

One aspect of the method provides that the scaling factor is determined by taking into account a time interval dt of the reading out of a k-space row associated with the respective core segment relating to the excitation pulse. The time interval dt is typically given for each k-space row by the MR control sequence, in particular by a specified echo time $T_E$ and/or a sequence of the k-space rows to be filled in the context of an echo train. Consequently, a mean time interval dt can also be determined for each core segment. A core segment can, however also comprise solely k-space rows, which were filled in each case with the same time interval dt in the context of a plurality of echo trains. With an acquisition of MR data corresponding to an echo train induced by an excitation pulse followed by a plurality of refocusing pulses, the intensity of an MR signal is typically proportional to $\exp(-dt/T_2)$, where $T_2$ is a $T_2$ relaxation time of at least one section of the examination region and/or a mean $T_2$ relaxation time of the examination region. It has been found that the mean signal intensity of the MR data for the respective core segment is dt-dependent. Based on dt, the mean signal intensity of the MR data for the respective core segment can accordingly be determined preferably mathematically and/or theoretically and an experimental ascertainment of the mean signal intensity of the MR data for the core segments can be omitted.

Taking account of dt in the determination of the scaling factor below a time interval dt accordingly allows a particularly accurate and robust adaptive reconstruction.

One aspect of the method provides that the time interval dt influences the scaling factor S in accordance with the dependence S~exp(-T$_2$/dt), where T$_2$ is a mean T$_2$ relaxation time of at least one section of the examination region. T$_2$ can also be the longest T$_2$ relaxation time of tissue that occurs in the examination region. Assuming that the intensity of an MR signal is typically proportional to exp(-dt/T$_2$), the scaling factor in accordance with this aspect ensures that the scaled MR data of the core segments has a uniform signal intensity. This increases the quality of the reconstructed image data.

One aspect of the method provides that the time interval dt influences the scaling factor S in accordance with the dependence S=A*exp(-T$_2$/dt)+B, where T$_2$ is a mean T$_2$ relaxation time of at least one section of the examination region and A and B are optimization parameters in the context of the determination of the scaling factor. This aspect allows an individual optimization in respect of a reduction of possible artifacts.

One aspect of the method provides that A and B are optimized in such a way that the difference between the peripheral signal and the mean signal intensity of the MR data of two core segments, directly adjoining the peripheral region, of the at least three core segments is minimized.

A core segment directly adjoining the peripheral region is preferably characterized in that one k-space row of two directly adjacent k-space rows is incorporated by the core segment and the other k-space row of the two directly adjacent k-space rows is incorporated by the peripheral region. The two core segments, directly adjoining the peripheral region, of the at least three core segments preferably lie outside of the center of the k-space. The two core segments, directly adjoining the peripheral region, of the at least three core segments are typically separated from each other by at least one core segment.

A minimization of the difference between the peripheral signal and the mean signal intensity of the scaled MR data of two core segments directly adjoining the peripheral region in the context of determination of the scaling factor accordingly allows a particularly good reduction of artifacts. The possibility of the corresponding selection of the optimization parameters by taking into account the time interval dt can take place particularly robustly and quickly.

One aspect of the method provides that A and B are optimized in such a way that the scaling factor equal to one is assigned to the core segment comprising MR data with the time interval dt corresponding to a defined echo time T$_E$. The optimization parameters can be defined in accordance with this aspect by A=exp(T$_2$/T$_E$) and/or B=0. Typically, the central core segment of the at least three core segments comprises MR data, which is acquired with a time interval dt corresponding to the echo time T$_E$ relating to the excitation pulse. The central core segment typically comprises the center of the k-space. The echo time TE is typically a parameter defined in the context of the MR control sequence used, which influences the contrast of the image data to be reconstructed and/or a sequence of the k-space rows to be filled. The mean signal intensity of the MR data of the central core segment typically correlates with the signal-to-noise ratio, for which reason a reduction has an adverse effect on the image quality of the image data to be reconstructed.

One aspect of the method provides that the MR data of the peripheral region comprises a signal simulated by means of a neural network. The MR data of the peripheral region is preferably simulated by using a trained function and/or by taking into account the MR data of the core region and/or by taking into account the MR data of at least one core segment adjacent to the peripheral region. Such MR data of the peripheral region is particularly compatible with the examination region and/or the MR data of the core region. The MR data of the core region can be scaled as a function of MR data of the peripheral region simulated in such a way and/or in particular the corresponding peripheral signal thereof particularly precisely, so the resulting reconstructed image data has particularly small artifacts.

One aspect of the method provides that the time interval dt of reading out all k-space rows associated with one core segment of the at least three core segments relating to the excitation pulse of the corresponding echo train is the same. In accordance with this aspect, at least one core segment, in particular the central core segment, comprises solely k-space rows, which were filled in each case with the same time interval dt in the context of a plurality of echo trains. This allows a particularly constant signal intensity of the MR data in the respective core segment.

One aspect of the method provides that the time interval dt of reading out k-space rows associated with at least one core segment of the at least three core segments relating to the excitation pulse of the corresponding echo train is mutually different. Corresponding to the length of the echo train and the selected echo time T$_E$ there can be at least one core segment, which is filled with MR data with variable time interval dt. This core segment typically lies outside of the center of the k-space and/or is a core segment adjacent to the peripheral region. Scaling of the MR data of such a core segment is particularly important since it allows a smooth transition to the peripheral region and reduces ring artifacts thereby.

Furthermore, the disclosure starts from a reconstruction unit comprising an ascertainment unit and a scaling unit. The reconstruction unit is designed to carry out an disclosed method for an adaptive reconstruction of MR data.

For this, the reconstruction unit typically has an input, an ascertainment unit, a determination unit, a scaling unit, a filtering unit and an output. The reconstruction unit can be provided with MR data via the input. The reconstruction unit can be provided with further functions, algorithms or parameters required in the method via the input. The ascertainment unit is preferably designed for ascertainment of a peripheral signal based on the MR data of the peripheral region. The determination unit is preferably designed for determination of a scaling factor for each core segment by taking into account the peripheral signal and a mean signal intensity of the MR data for the respective core segment. The scaling unit is preferably designed for scaling the MR data of the core region by taking into account the MR data of each core segment and the scaling factor corresponding to the respective core segment. The filtering unit is preferably designed for generation of filtered MR data by way of combination of the scaled MR data of the core region with the MR data of the peripheral region and/or for reconstruction of image data from the filtered MR data. The image data and/or further results of an aspect of the disclosed method can be provided via the output. The input, the ascertainment unit, the determination unit, the scaling unit, the filtering unit and the output are typically connected together.

Aspects of the disclosed reconstruction unit are designed analogously to the aspects of the disclosed method. The reconstruction unit can have further control components, which are necessary and/or advantageous for carrying out an disclosed method. Computer programs and further software, by means of which the processor unit of the reconstruction unit automatically controls and/or carries out a process sequence of an disclosed method, can be saved on a memory unit of the reconstruction unit.

A disclosed computer program product can be loaded directly into a memory unit of a programmable reconstruction unit and has program code means in order to carry out an disclosed method when the computer program product is executed in the reconstruction unit. As a result, the disclosed method can be carried out quickly, in an identically repeatable manner and robustly. The computer program product is configured such that it can carry out the disclosed method steps by means of the reconstruction unit. The reconstruction unit has to have in each case the requirements such as an appropriate working memory, an appropriate graphics card or an appropriate logic unit, so the respective method steps can be efficiently carried out. The computer program product is saved for example on an electronically readable medium or stored on a network or server from where it can be loaded into the processor of a local reconstruction unit. Furthermore, control information of the computer program product can be saved on an electronically readable data carrier. The control information of the electronically readable data carrier can be configured in such a way that it carries out an disclosed method when the data carrier is used in a reconstruction unit. Examples of electronically readable data carriers are a DVD, a magnetic tape or a USB stick on which electronically readable control information, in particular software, is saved. When this control information (software) is read from the data carrier and saved in a reconstruction unit, all disclosed aspects of the previously described method can be carried out.

Furthermore, the disclosure starts from an electronically readable data carrier on which a program is stored, which is provided for carrying out a method for an adaptive reconstruction of MR data.

Furthermore, the disclosure starts from a magnetic resonance device with a control unit comprising a disclosed reconstruction unit.

The control unit is typically designed for actuation of the magnetic resonance device in accordance with an MR control sequence. The control unit can be provided with the MR control sequence via an input.

The MR control sequence can provide and/or initiate an acquisition comprising a multiple time-sequential carrying out of the following steps in order in each case to capture the MR data of an echo train:
switching an excitation pulse,
switching a plurality of refocusing pulses, wherein between two successive refocusing pulses, one reading out each takes place of a k-space row, in particular an echo of the echo train, associated with one of the at least three core segments.

The control unit and/or the reconstruction unit can be integrated in the magnetic resonance device. The control unit and/or the reconstruction unit can also be installed separately from the magnetic resonance device. The control unit and/or the reconstruction unit can be connected to the magnetic resonance device.

The magnetic resonance device can have further control components, which are necessary and/or advantageous for carrying out a disclosed method. The magnetic resonance device can also be designed to send and/or receive and/or process control signals in order to carry out a disclosed method. Computer programs and further software, by means of which the processor unit of the control unit automatically controls and/or executes a process sequence of a disclosed method, can be saved on a memory unit of the control unit.

The advantages of the disclosed reconstruction unit, of the disclosed magnetic resonance device, of the disclosed computer program product and of the disclosed electronically readable data carrier substantially correspond to the advantages of the disclosed method for an adaptive reconstruction of MR data, which have been previously stated in detail. Features, advantages or alternative aspects mentioned in this connection can likewise also be transferred to the other claimed subject matters, and vice versa.

BRIEF DESCRIPTION OF THE DRAWINGS

Further advantages, features and details of the disclosure can be found in the exemplary aspects described below and with reference to the drawings, in which:

FIG. 1 shows a disclosed reconstruction unit in a schematic representation,

FIG. 2 shows a disclosed magnetic resonance device in a schematic representation, FIG. 3 shows a flowchart of a first aspect of a disclosed method, FIG. 4 shows a k-space in a schematic representation, FIG. 5 shows capturing MR data of the core region in a first echo train in a schematic representation, FIG. 6 shows capturing MR data of the core region in a further echo train in a schematic representation, FIG. 7 shows a signal intensity of the MR data prior to scaling, FIG. 8 shows a signal intensity of filtered MR data with a scaling factor in accordance with a first aspect, and FIG. 9 shows a signal intensity of filtered MR data with a scaling factor in accordance with a second aspect.

DETAILED DESCRIPTION

FIG. 1 shows a disclosed reconstruction unit 1 in a schematic representation. The reconstruction unit 1 typically comprises an input 2, an ascertainment unit 3, a determination unit 4, a scaling unit 5, a filtering unit 6 and an output 7. MR data can be provided via the input 2. The ascertainment unit 3 is typically designed to detect a peripheral signal based on the MR data of the peripheral region 42. The ascertainment unit 3 can also be designed to simulate a signal not equal to zero as the MR data of the peripheral region 42. The determination unit 4 is typically designed to determine a scaling factor for each core segment 51, 52, 53, 54, 55 by taking into account the peripheral signal and a mean signal intensity of the MR data for the respective core segment 51, 52, 53, 54, 55. The scaling unit 5 is typically designed to scale MR data of the core region 50 by taking into account the MR data of each core segment 51, 52, 53, 54, 55 and that of the scaling factor corresponding to the respective core segment 51, 52, 53, 54, 55. The filtering unit 6 is typically designed to generate filtered MR data by way of combination of the scaled MR data of the core region 50 with the MR data of the peripheral region 42 and/or to reconstruct the filtered MR data to form image data. The image data can be provided via the output 7. The disclosed reconstruction unit 1 is accordingly configured for carrying out a disclosed method for an adaptive reconstruction of MR data.

For this, the reconstruction unit 1 has computer programs and/or software, which can be loaded directly into a memory unit (not shown in detail) of the reconstruction unit 1, with program means in order to carry out a method for an adaptive reconstruction of MR data when the computer programs and/or software are executed in the reconstruction unit 1. The reconstruction unit 1 has for this purpose a processor (not shown in detail), which is configured for execution of the computer programs and/or software. Alternatively, the computer programs and/or software can also be saved for this purpose on an electronically readable data carrier 21 formed separately from the reconstruction unit 1, with it being possible for data access by the reconstruction unit 1 to the electronically readable data carrier 21 to take place via a data network.

A method for an adaptive reconstruction of MR data can also be in the form of a computer program product, which implements the method on the reconstruction unit 1 when it is executed on the reconstruction unit 1. Similarly, an electronically readable data carrier 21 with electronically readable control information saved thereon can be present, which comprises at least one such computer program product just described and is configured in such a way that it carries out the described method when the electronically readable data carrier 21 is used in a reconstruction unit 1.

FIG. 2 shows a magnetic resonance device 11 for carrying out a disclosed method and for the acquisition of MR data, comprising MR data of a core region 50 of a k-space 40 and MR data of a peripheral region 42 of the k-space 40 in a schematic representation. The magnetic resonance device 11 comprises a detector unit formed by a magnetic unit 13, with a main magnet 17 for generating a strong and, in particular, constant main magnetic field 18. In addition, the magnetic resonance device 11 has a cylindrical patient receiving region 14 for receiving a patient 15, with the patient receiving region 14 being cylindrically enclosed in a circumferential direction by the magnetic unit 13. The patient 15 can be pushed by means of a patient supporting apparatus 16 of the magnetic resonance device 11 into the patient receiving region 14. The patient supporting apparatus 16 has for this purpose a patient couch, which is movably arranged inside the magnetic resonance device 11.

The magnetic unit 13 also has a gradient coil unit 19, which is used for a spatial encoding during an imaging process. The gradient coil unit 19 is actuated by means of a gradient control unit 28. Furthermore, the magnetic unit 13 has a radio-frequency antenna unit 20, which in the case shown is designed as a body coil permanently integrated in the magnetic resonance device 11, and a radio-frequency antenna control unit 29 for excitation of a polarization, which is established in the main magnetic field 18 generated by the main magnet 17. The radio-frequency antenna unit 20 is actuated by the radio-frequency antenna control unit 29 and irradiates high-frequency radio-frequency pulses into an examination space, which is substantially formed by the patient receiving region 14.

The magnetic resonance device 11 has a control unit 24 for control of the main magnet 17, the gradient control unit 28 and the radio-frequency antenna control unit 29. The control unit 24 centrally controls the magnetic resonance device 11, such as carrying out MR control sequences. The control unit 24 is typically designed for actuation of the magnetic resonance device 11 for acquisition of MR data of the core region 50, with multiple time-sequential carrying out of the following steps taking place in order in each case to capture the MR data of an echo train: switching an excitation pulse 38; and switching a plurality of refocusing pulses 39, wherein between two successive refocusing pulses 39, one reading out each takes place of a k-space row 41, in particular an echo of the echo train, associated with one of the at least three core segments 51, 52, 53, 54, 55.

In addition, the control unit 24 comprises a disclosed reconstruction unit 1 for reconstruction of medical image data, which is captured during the magnetic resonance examination. The magnetic resonance device 11 has a display unit 25. Control information such as control parameters and reconstructed image data can be displayed for a user on the display unit 25, for example on at least one monitor. In addition, the magnetic resonance device 11 has an input unit 26 by means of which information and/or control parameters can be input by a user during a measurement process. The control unit 24 can comprise the gradient control unit 28 and/or radio-frequency antenna control unit 29 and/or the display unit 25 and/or the input unit 26.

The illustrated magnetic resonance device 11 can of course comprise further components, which magnetic resonance devices 11 conventionally have. A general mode of operation of a magnetic resonance device 11 is known to a person skilled in the art, moreover, so a detailed description of the further components is omitted. The magnetic resonance device 11 is thus configured, together with the reconstruction unit 1, for carrying out a disclosed method.

FIG. 3 shows a flowchart of a first aspect of a disclosed method. Method step 110 provides the provision of MR data comprising MR data of a core region 50 of a k-space 40 and MR data of a peripheral region 42 of the k-space 40. The MR data of the peripheral region 42 comprises a simulated signal not equal to zero. The MR data of the core region 50 is acquired data and is subdivided into at least three core segments 51, 52, 53, 54, 55. Method step 120 comprises ascertainment of a peripheral signal based on the MR data of the peripheral region 42. Method step 130 comprises determination of a scaling factor for each core segment 51, 52, 53, 54, 55 by taking into account the peripheral signal and a mean signal intensity of the MR data for the respective core segment 51, 52, 53, 54, 55. In method step 140 the MR data of the core region 50 is scaled by taking into account the MR data of each core segment 51, 52, 53, 54, 55 and that of the scaling factor corresponding to the respective core segment 51, 52, 53, 54, 55. Method step 150 provides the generation of filtered MR data 61 by way of combination of the scaled MR data of the core region 50 with the MR data of the peripheral region 42. The filtered MR data 61 is reconstructed in method step 160 to form image data.

FIG. 4 shows a k-space 40 in a schematic representation. The k-space 40 comprises a peripheral region 42, which comprises MR data in the form of a simulated signal, in particular simulated by means of a neural network, not equal to zero. The k-space 40 comprises a core region 50, which is subdivided into at least three, in the illustrated case five core segments 51, 52, 53, 54, 55. Each core segment 51, 52, 53, 54, 55 comprises mutually parallel k-space rows 41 in the direction of the frequency encoding $k_{RO}$, which is perpendicular to the phase encoding direction $k_{PE}$. The core segments 51, 52, 53, 54, 55 are arranged relative to each other in such a way that the parallel k-space rows 41 incorporated by them are parallel to each other. The core segments 51, 52, 53, 54, 55 are typically disjunct and/or sequentially arranged in the phase encoding direction $k_{PE}$. The center of the k-space 40 typically corresponds to the center of the core region 50. The center of the k-space 40 is typically incorporated by the core region 50.

The peripheral region 42 can completely surround the core region 50. The core region 50 is typically limited by $[-k_{PE,s}, k_{PE,s}]$ in the phase encoding direction $k_{PE}$.

The peripheral region 42 typically adjoins the peripheral edges of the core region 50 in the phase encoding direction $k_{PE}$. The peripheral region 42 typically comprises complete k-space rows 41 only outside of the section $[-k_{PE,s}, k_{PE,s}]$ in the phase encoding direction $k_{PE}$. K-space rows 41 located inside the section $[-k_{PE,s}, k_{PE,s}]$ are at most partially incorporated by the peripheral region 42, in particular only for high values for k in the direction of the frequency encoding $k_{RO}$. The peripheral region 42 can be described by the value range $[-k_{PE,E}, -k_{PE,s}[\cup]k_{PE,s}, k_{PE,E}]$ or by $[-\infty, -k_{PE,s}[\cup] k_{PE,s}, \infty]$ in the phase encoding direction $k_{PE}$. The peripheral region 42 is free from the center of the k-space 40. The center of the k-space 40 is defined by $k_{PE}=0$, $k_{RO}=0$.

FIG. 5 shows capturing of MR data of the core region 50 in a first echo train in a schematic representation.

The first echo train is defined by the MR control sequence and comprises an excitation pulse 38 followed by a plurality of refocusing pulses 39, wherein between two successive refocusing pulses 39, one reading out each of a k-space row 41, in particular with each echo 31, 32, 33, 34 of the echo train, takes place. FIG. 5 illustrates the amplitude of the RF pulses and the resulting echoes as a function of the time axis. The MR data of the first echo 31 is associated with a k-space row 41 of the first core segment 51. The MR data of the second echo 32 is associated with a k-space row 41 of the second core segment 52. The MR data of the third echo 33 is associated with a k-space row 41 of the third core segment 53. The MR data of the fourth echo 34 is associated with a k-space row 41 of the fourth core segment 54.

This echo train is preferably repeated frequently in such a way until the k-space rows 41 of the core segments 51, 52, 53, 54 are filled with MR data, and this is dependent in particular on the size of the core segments 51, 52, 53, 54 and/or the number of k-space rows 41 per core segment 51, 52, 53, 54. The time interval dt of reading out all k-space rows 41 associated with one core segment of the core segments 51, 52, 53, 54 relating to the excitation pulse 38 of the corresponding echo train is preferably the same. In the illustrated case, the third core segment 53 comprises the center of the k-space 40 and it is filled by the MR data of the third echo 33. The time interval dt of the third echo 33 of the excitation pulse 38 accordingly typically defines the echo time $T_E$ of the MR control sequence.

FIG. 6 shows capturing of MR data of the core region 50 in a further echo train in a schematic representation. FIG. 6 differs from FIG. 5 in that MR data of all echoes 31, 32, 33, 34 of the further echo train are used to fill the k-space rows 41 in the fifth core segment 55. The time interval dt of reading out the k-space rows 41 associated with the fifth core segment 55 relating to the excitation pulse 38 of the corresponding echo train is mutually different.

FIG. 7 shows a signal intensity 60 of the MR data prior to scaling as a function of the position in the phase encoding direction $k_{PE}$. This signal intensity 60 of the MR data prior to scaling can be achieved, for example, by capturing MR data of the core region 50 in accordance with the method described in FIGS. 5 and 6. It should be noted here that the signal intensity 60 of the captured MR data is typically proportional to $\exp(-dt/T_2)$. $T_2$ is typically a mean $T_2$ relaxation time of at least one section of the examination region. The signal intensity 60 of the captured MR data is accordingly typically dependent on the time interval dt of reading out the respective k-space row 41 relating to the excitation pulse 38. The scaling factor is preferably determined by taking into account the time interval dt of reading out a k-space row 41 associated with the respective core segment 51, 52, 53, 54, 55 relating to the excitation pulse 38.

FIG. 8 shows a first signal intensity 61 of filtered MR data with a first scaling factor in accordance with a first aspect. The first scaling factor is preferably proportional to $\exp(-T_2/dt)$ and/or can be described by $A*\exp(-T_2/dt)+B$, where and A and B are optimization parameters in the context of determination of the scaling factor. Method step 130, in other words the determination of the scaling factor, can take place in such a way that the difference between the peripheral signal and the mean signal intensity of the scaled MR data of a core segment 51, 55 adjacent to the peripheral region 42 is minimized. This can be achieved by optimization of A and B by taking into account $A*\exp(-T_2/dt)+B$ for the first scaling factor.

FIG. 9 shows a second signal intensity 62 of filtered MR data with a scaling factor in accordance with a second aspect. The second scaling factor can preferably be described by $A*\exp(-T_2/dt)+B$, where A and B are optimized in such a way that the scaling factor equal to one is assigned to the third core segment 53, in other words the core segment comprising MR data with the time interval dt corresponding to a defined echo time $T_E$.

Although the disclosure has been illustrated and described in detail by the preferred exemplary aspects, it is not limited by the disclosed examples and a person skilled in the art can derive other variations herefrom without departing from the scope of the disclosure.

The invention claimed is:

1. A method for an adaptive reconstruction of magnetic resonance (MR) data, comprising:
   providing MR data including MR data of a core region of a k-space and MR data of a peripheral region of the k-space, wherein:
      the core region of the k-space comprises at least three core segments,
      each core segment of the at least three core segments includes mutually parallel k-space rows and the core segments are arranged relative to each other in such a way that the parallel k-space rows incorporated by therein are mutually parallel,
      the MR data of the peripheral region comprises a simulated signal not equal to zero, and
      the MR data of the core region is acquired by multiple time-sequential carrying out of steps in order in each case to capture the MR data of an echo train, wherein the steps comprise:
         switching an excitation pulse; and
         switching a plurality of refocusing pulses,
            wherein between two successive refocusing pulses, one reading out each takes place of a k-space row, with each echo of the echo train, associated with one of the at least three core segments,
   ascertaining a peripheral signal based on the MR data of the peripheral region;
   determining a scaling factor for each of the core segments by taking into account the peripheral signal and a mean signal intensity of the MR data for the respective core segment;
   scaling the MR data of the core region by taking into account the MR data of each of the core segments and that of the scaling factor corresponding to the respective core segment;
   generating filtered MR data by combining the scaled MR data of the core region with the MR data of the peripheral region; and
   reconstructing image data from the filtered MR data.

2. The method as claimed in claim 1, wherein the scaling factor is determined such that a difference between the peripheral signal and the mean signal intensity of the MR data of a core segment adjacent to the peripheral region is minimized.

3. The method as claimed in claim 1, wherein the scaling factor is determined by taking into account a time interval dt of reading out a k-space row associated with the respective core segment relating to the excitation pulse.

4. The method as claimed in claim 3, wherein the time interval dt influences the scaling factor S in accordance with a dependence $S \sim \exp(-T_2/dt)$, where $T_2$ is a mean $T_2$ relaxation time of at least one section of an examination region.

5. The method as claimed in claim 3, wherein the time interval dt influences the scaling factor S in accordance with dependence $S = A*\exp(-T_2/dt)+B$, where $T_2$ is a mean $T_2$ relaxation time of at least one section of an examination region, and A and B are optimization parameters in a context of determination of the scaling factor.

6. The method as claimed in claim 5, wherein A and B are optimized such that a difference between the peripheral signal and the mean signal intensity of MR data of two core segments, directly adjoining the peripheral region, of the at least three core segments is minimized.

7. The method as claimed in claim 5, wherein A and B are optimized such that the scaling factor equal to one is assigned to the core segment comprising MR data with the time interval dt corresponding to a defined echo time.

8. The method as claimed in claim 1, wherein the MR data of the peripheral region comprises a signal simulated by using a neural network.

9. The method as claimed in claim 3, wherein the time interval dt of reading out all k-space rows associated with one core segment of the at least three core segments is the same as the excitation pulse of the corresponding echo train.

10. The method as claimed in claim 3, wherein the time interval dt of reading out k-space rows associated with at least one core segment of the at least three core segments is different from the excitation pulse of the corresponding echo train.

11. A reconstruction unit, comprising:
an ascertainment unit; and
a scaling unit, which is configured to carry out a method for an adaptive reconstruction of MR data as claimed in claim 1.

12. A magnetic resonance device with a control unit comprising a reconstruction unit, which is configured to carry out a method for an adaptive reconstruction of MR data as claimed in claim 1.

13. A non-transitory computer program product, which comprises a program and is loadable directly into a memory of a programmable reconstruction unit to carry out a method for an adaptive reconstruction of MR data as claimed in claim 1 when the program is executed in the programmable reconstruction unit.

* * * * *